United States Patent
Wallner et al.

(10) Patent No.: US 7,342,293 B2
(45) Date of Patent: Mar. 11, 2008

(54) BIPOLAR JUNCTION TRANSISTORS (BJTS) WITH SECOND SHALLOW TRENCH ISOLATION (STI) REGIONS, AND METHODS FOR FORMING SAME

(75) Inventors: Thomas A. Wallner, Pleasant Valley, NY (US); Thomas N. Adam, Poughkeepsie, NY (US); Stephen W. Bedell, Wappingers Falls, NY (US); Joel P. De Souza, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 11/164,757

(22) Filed: Dec. 5, 2005

(65) Prior Publication Data

US 2007/0126080 A1   Jun. 7, 2007

(51) Int. Cl.
*H01L 27/082* (2006.01)
*H01L 27/102* (2006.01)
*H01L 29/70* (2006.01)
*H01L 31/11* (2006.01)
*H01L 29/00* (2006.01)

(52) U.S. Cl. ...................... 257/565; 257/374; 257/446; 257/511; 257/512; 257/525; 257/526; 257/527; 257/555; 257/556; 257/557; 257/558; 257/564; 257/592

(58) Field of Classification Search ........ 257/511–512, 257/525–527, 555–558, 564–565, 592, 374, 257/446
See application file for complete search history.

(56) References Cited

U.S. PATENT DOCUMENTS

| | | | |
|---|---|---|---|
| 3,919,060 A | | 11/1975 | Pogge et al. ................ 438/355 |
| 4,819,055 A | * | 4/1989 | Nakazato et al. ........... 257/518 |
| 5,892,264 A | * | 4/1999 | Davis et al. ................ 257/511 |
| 6,177,717 B1 | * | 1/2001 | Chantre et al. ............. 257/565 |
| 6,365,462 B2 | * | 4/2002 | Baliga ........................ 438/270 |
| 6,610,578 B2 | * | 8/2003 | Norstrom et al. ........... 438/369 |
| 6,699,741 B1 | * | 3/2004 | Sadovnikov et al. ....... 438/197 |
| 6,864,560 B2 | * | 3/2005 | Khater et al. ............... 257/565 |
| 6,909,164 B2 | * | 6/2005 | Gray et al. ................. 257/565 |
| 7,022,578 B2 | * | 4/2006 | Verma et al. ............... 438/312 |
| 7,102,205 B2 | * | 9/2006 | Chidambarrao et al. .... 257/592 |
| 7,118,995 B2 | * | 10/2006 | Dupuis et al. ............. 438/488 |
| 7,180,157 B2 | * | 2/2007 | Freeman et al. ........... 257/565 |

(Continued)

FOREIGN PATENT DOCUMENTS

JP        02040922 A   *   2/1990

*Primary Examiner*—Ida M. Soward
(74) *Attorney, Agent, or Firm*—Scully, Scott, Murphy & Presser P.C.; H. Daniel Schnurmann (57) ABSTRACT

The present invention relates to bipolar junction transistors (BJTS). The collector region of each BJT is located in a semiconductor substrate surface and adjacent to a first shallow trench isolation (STI) region. A second STI region is provided, which extends between the first STI region and the collection region and undercuts a portion of the active base region with an undercut angle of not more than about 90°. For example, the second STI region may a substantially triangular cross-section with an undercut angle of less than about 90°, or a substantially rectangular cross-section with an undercut angle of about 90°. Such a second STI region can be fabricated using a porous surface section formed in an upper surface of the collector region.

20 Claims, 10 Drawing Sheets

U.S. PATENT DOCUMENTS

| | | | |
|---|---|---|---|
| 7,202,514 B2 * | 4/2007 | Ahmed et al. | 257/197 |
| 7,262,100 B2 * | 8/2007 | Wakimoto et al. | 438/270 |
| 2002/0132438 A1 * | 9/2002 | Dunn et al. | 438/343 |
| 2003/0006484 A1 * | 1/2003 | Asai et al. | 257/565 |
| 2003/0098465 A1 * | 5/2003 | Suzumura et al. | 257/197 |
| 2003/0189239 A1 * | 10/2003 | Kalnitsky et al. | 257/586 |
| 2004/0262715 A1 * | 12/2004 | Miura et al. | 257/565 |
| 2005/0012180 A1 * | 1/2005 | Freeman et al. | 257/565 |
| 2005/0191911 A1 * | 9/2005 | Greenberg et al. | 439/762 |
| 2005/0250289 A1 * | 11/2005 | Babcock et al. | 438/309 |
| 2007/0085167 A1 * | 4/2007 | Saitoh et al. | 257/565 |

* cited by examiner

BIPOLAR JUNCTION TRANSISTORS (BJTS) WITH SECOND SHALLOW TRENCH ISOLATION (STI) REGIONS, AND METHODS FOR FORMING SAME

FIELD OF THE INVENTION

The present invention relates to bipolar junction transistors (BJTs). More particularly, the present invention relates to BJTs having second shallow trench isolation (STI) regions that undercut active base regions of such BJTs with undercut angles of not more than 90°, as well as methods for forming same.

BACKGROUND OF THE INVENTION

Figure 1:
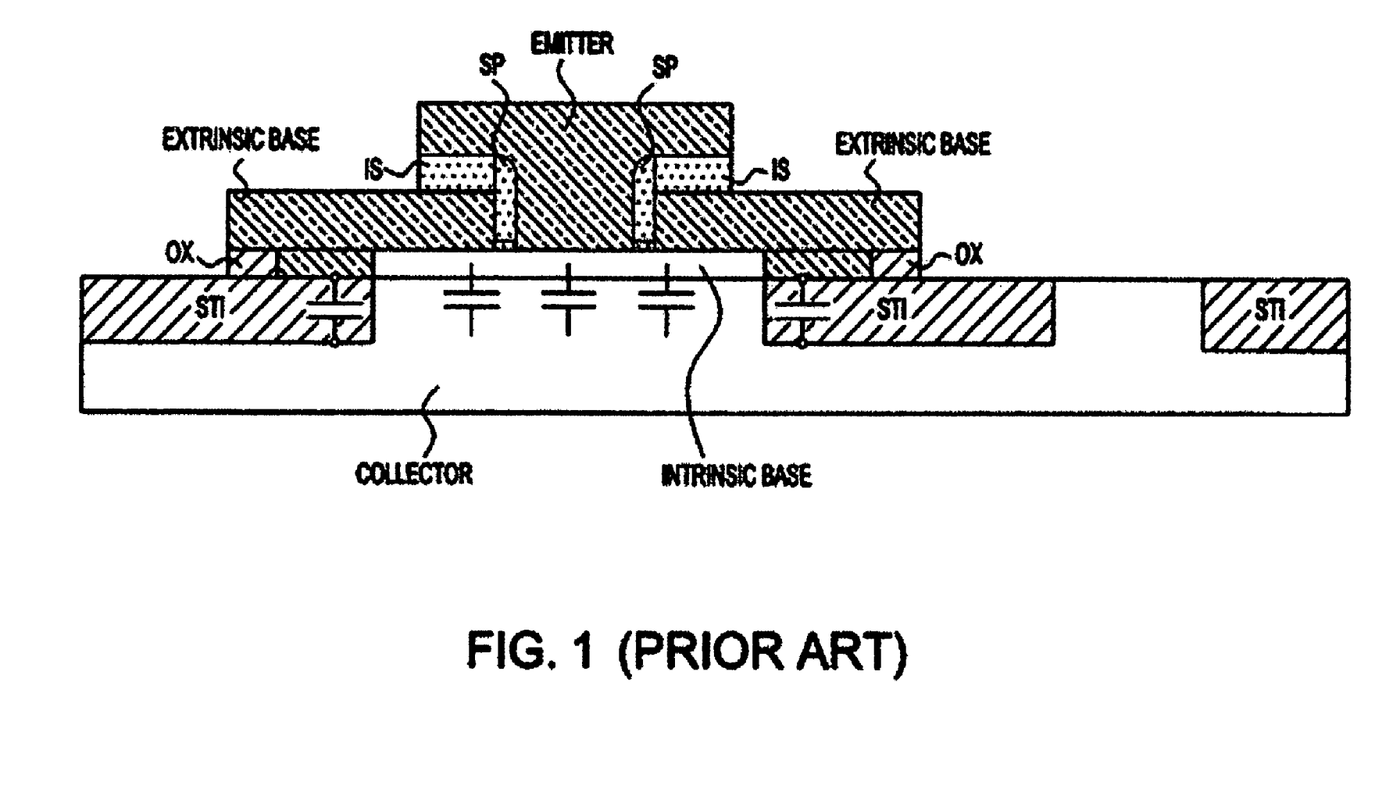
FIG. 1 shows a conventional BJT device.

FIG. 1 shows a conventional bipolar junction transistor (BJT), which typically includes an emitter, a collector, an active base, and an extrinsic base. The collector is formed in the surface of a semiconductor substrate between a pair of shallow trench isolation (STI) regions, which electrically isolates the collector of the BJT from other device structures located in the substrate surface. The active base, typically formed of silicon and silicon germanium, is located above the collector but underneath the emitter, and it is in mechanical and electrical contact with both the collector and emitter. The extrinsic base, which is adjacent to the emitter, is located over a portion of the active base and portions of the STI regions. The emitter is typically a T-shaped emitter. A shoulder section of such a T-shaped emitter is located over the extrinsic base region, while a leg section thereof extends through the extrinsic base and contacts an upper surface of the active base. The emitter and the extrinsic base are electrically isolated from each other by an insulator layer (IS) and sidewall spacers (SP).

The base-to-collector capacitance of such a conventional BJT is the sum of: (1) the capacitance between the active base and the collector inside the active area (which is defined by the emitter opening), (2) the capacitance between the active and extrinsic bases and the collector outside the active area and within the STI regions, and (3) the capacitance between the extrinsic base and the collector across the STI regions, as shown in FIG. 1.

The base-to-collector capacitance has a significant influence on the cut-off frequency ($f_T$) and the maximum oscillation frequency ($f_{max}$) of the BJT device, which are the most representative measures for the operation speed of the BJT device. Therefore, minimization of the base-to-collector capacitance can effectively improve the operation speed of the BJT device.

The extrinsic component of the base-to-collector capacitance, which is the capacitance between the active/extrinsic bases and the collector outside the active area and which is typically referred to as the parasitic capacitance, comprises more than half of the total base-to-controller capacitance. Therefore, reduction of the parasitic capacitance will lead to significant improvement of $f_T$ and $f_{max}$ and will effectively increase the operation speed of the BJT device.

Because the parasitic capacitance of the BJT device is caused by the overlap between the active/extrinsic bases and the collector outside the active area, one possible approach for reducing the parasitic capacitance is to reduce such a base-collector overlap. However, minimization of the base-collector overlap is difficult for two reasons: (1) the lithographic process typically used for fabricating the active/extrinsic bases is limited by overlay and alignment tolerances, and (2) by decreasing the extrinsic overlap area, there is a corresponding increase in base resistance, which is another key factor that affects the performance of BJTs.

There is therefore a need for improved BJT structures that are characterized by reduced parasitic capacitances, without the corresponding reduced base resistance. There is also a need for methods of fabricating such improved BJT structures with high precision at reduced costs.

SUMMARY OF THE INVENTION

The present invention, in one aspect, relates to a bipolar junction transistor (BJT) that comprises: a collector region located in a semiconductor substrate surface and adjacent to a first shallow trench isolation (STI) region; an active base region located on the collector region and having an upper surface and a lower surface; an extrinsic base region located on the active base region and over the STI region; an emitter region having at least a portion that extends through the extrinsic base region and contacts the upper surface of the active base region; and a second STI region that extends from the first STI region into the collector region and undercuts a portion of the active base region with an undercut angle of not more than about 90°.

The phrase "undercut angle" as used herein refers to the angle defined by two intersecting surfaces of the second STI region. Specifically, a first of such surfaces is in direct contact with the lower surface of the active base region, and a second of such surfaces is in direct contact with the collector region. Note that the undercut angle is also defined by the lower surface of the active base region and a sidewall surface of the collector region that is in direct contact with the second STI region.

In one specific embodiment of the present invention, the undercut angle is about 90°. The second STI region preferably, but not necessarily, has a substantially rectangular cross-section.

In an alternative embodiment of the present invention, the undercut angle is less than 90° and preferably not more than about 54.7°. The second STI region preferably, but not necessarily, has a substantially triangular cross-section.

The term "substantially rectangular" or "substantially triangular" as used herein refers to a shape that resembles a rectangle or a triangle as a whole, although such a shape may contain regions or sections that deviate from the definition of a perfect rectangle or triangle.

Another aspect of the present invention relates to a method for forming a BJT as described hereinabove, which contains a second STI region having a substantially triangular cross-section with an undercut angle of less than 90°. Such a method comprises at least the following steps: providing a semiconductor substrate surface that comprises a collector region adjacent to a first shallow trench isolation (STI) region; selectively porousifying an upper surface of the collector region to form a non-porous surface section adjacent to a porous surface section; forming an active base region over both the non-porous and porous surface sections of the collector region; selectively etching edges of the active base region and the collector region to form a notched region between the first STI region and the collection region, wherein a sidewall of the porous surface section of the collector region is exposed; anisotropically etching the collector region from the notched region to remove the porous surface section and a section of the collector region thereunder, thereby forming a cavity that has a substantially triangular cross-section and undercuts a portion of the active base region with an undercut angle of less than about 90°; and at least partially filling the cavity with an insulating material to form a second STI region that extends from the first STI region into the collector region, wherein the second STI region has a substantially triangular cross-section and undercuts a portion of the active base region with an undercut angle of less than about 90°.

Preferably but not necessarily, the upper surface of the collector region is selectively porousified by: selectively doping an upper surface of the collector region to form a doped surface region adjacent to an undoped surface region; and chemically or electrochemically etching the doped surface region to form a porous surface section, wherein the undoped surface region forms a non-porous surface section adjacent to the porous surface section.

Further, when the collector region comprises silicon, it is preferred that the anisotropic etching is carried out by using a hydroxide-based wet etching process that selectively etches the silicon along its (100) and (110) directions over its (111) direction.

Yet another aspect of the present invention relates to a method for forming a BJT as described hereinabove, which contains a second STI region having a substantially rectangular cross-section with an undercut angle of about 90°. Such a method comprises at least the following steps: providing a semiconductor substrate surface that comprises a collector region adjacent to a first shallow trench isolation (STI) region; selectively porousifying an upper surface of the collector region to form a non-porous surface section adjacent to a porous surface section; forming an active base region over both the non-porous and porous surface sections of the collector region; selectively etching edges of the active base region and the collector region to form a notched region between the first STI region and the collection region, wherein a sidewall of the porous surface section of the collector region is exposed; treating the porous surface section of the collector region by oxidization and/or nitrification to form a second STI region that has a substantially rectangular cross-section and undercuts a portion of the active base region with an undercut angle of about 90°; and at least partially filling the notched region with an insulating material, thereby connecting the first STI region with the second STI region.

Preferably, the porous surface section of the collector region is treated by oxidation, so that the resulting second STI region comprises an oxide or partial oxide. Alternatively, the porous surface section of the collector region is treated by nitrification, so that the resulting second STI region comprises a nitride. Further, the porous surface section of the collector region can be treated by oxidation and nitrification to form a second STI region that comprises an oxynitride.

Other aspects, features and advantages of the invention will be more fully apparent from the ensuing disclosure and appended claims.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on or over the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides an improved BJT structure that comprises an STI extension region for minimizing the parasitic capacitance between the active/extrinsic bases and the collector beyond the active area of the BJT device. Such an STI extension region extends between the conventional STI region and the collector region, while undercutting a portion of the active base region with an undercut angle of not more than 90°. The STI extension region is hereinafter referred to as the second STI region, in distinction from the conventional STI region, which is hereinafter referred to as the first STI region.

Figure 2A:
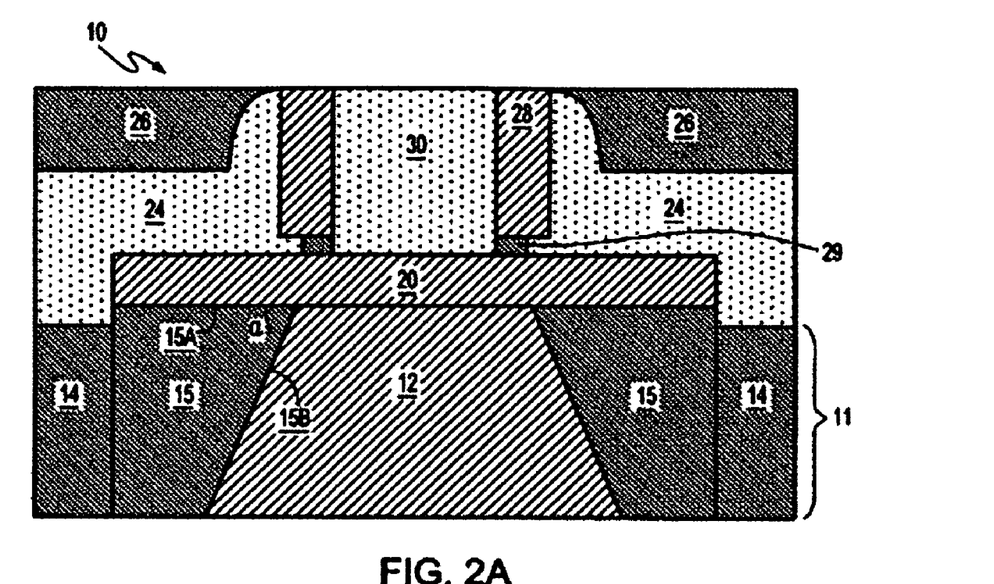
FIG. 2A shows a partial view of a BJT device that comprises a second STI region with an undercut angle of less than 90°, according to one embodiment of the present invention.
Figure 2B:
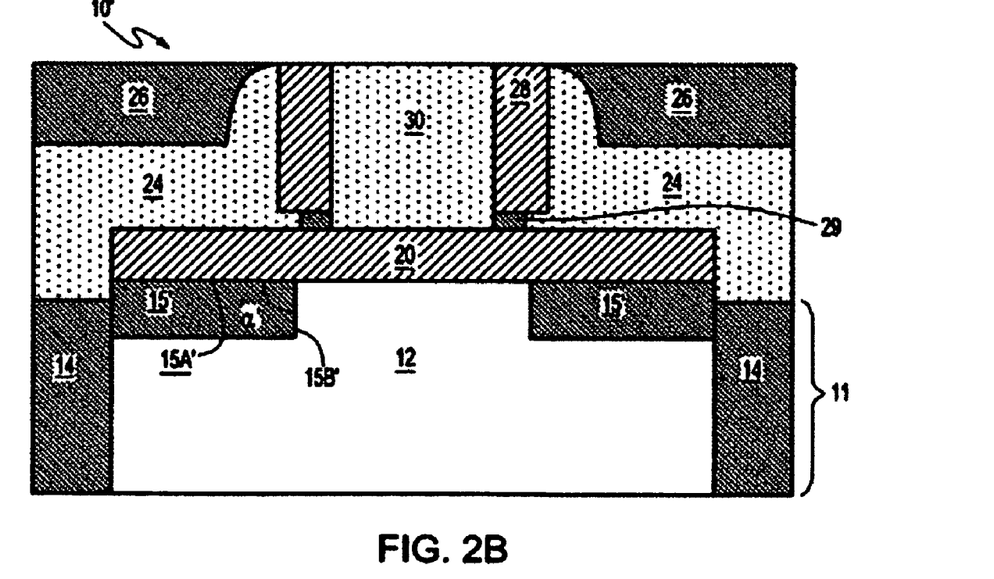
FIG. 2B shows a partial view of a BJT device that comprises a second STI region with an undercut angle of about 90°, according to one embodiment of the present invention.

Exemplary BJTs with such second STI regions of the present invention will now be illustrated in greater detail by referring to the accompanying FIGS. 2A and 2B. Note that in these drawings, which are not drawn to scale, like and/or corresponding elements are referred to by like reference numerals.

FIG. 2A shows a partial cross-sectional view of an exemplary BJT 10, which is constructed according to one embodiment of the present invention. Specifically, the BJT 10 is fabricated over a semiconductor substrate 11. The collector region 12 of the BJT 10 is located in an upper surface of the semiconductor substrate 11 and is adjacent to a first STI region 14. The active base region 20 of the BJT 10 is formed over the collector region 12, while the extrinsic base region 24 of the BJT 10 is formed over an outer portion of the active base region 20. The leg portion of the T-shaped emitter 30 (only partially visible from FIG. 2A) extends through the extrinsic base region 24 and directly contacts an upper surface of the active base region 20. An insulator layer 26 and sidewall spacers 28, 29 function to electrically isolate the extrinsic base region 24 from the T-shaped emitter 30.

FIG. 2A further shows a second STI region 15 that extends between the first STI region 14 and the collector region 12. The second STI region 15 undercuts the outer portion of the active base region with an undercut angle (α) of less than 90°, which is defined by a first surface 15A that is in direct contact with a lower surface of the active base region 20 and a second surface 15B that is in direct contact with the collector region 12.

Such a configuration of the second STI region, as shown in FIG. 2A, functions to effectively reduce the parasitic capacitance between the active/extrinsic bases 20, 24 and the collector region 12 outside the active area (which is defined by the emitter opening), without significantly increasing the resistance of the BJT device 10.

FIG. 2B shows a partial cross-sectional view of another exemplary BJT 10', which is constructed according to another embodiment of the present invention. Specifically, the BJT 10' comprises substantially the same components as the BJT 10 of FIG. 2A, with the exception that the second STI region 15' of the BJT 10' undercuts the outer portion of the active base region with an undercut angle (α') of approximately 90°, which is defined by a first surface 15A' that is in direct contact with a lower surface of the active base region 20 and a second surface 15B' that is in direct contact with the collector region 12. The second STI region 15' therefore has a cross-sectional shape that is substantially rectangular.

Such a configuration of the second STI region, as shown by FIG. 2B, can also reduce the parasitic capacitance between the active/extrinsic bases 20, 24 and the collector region 12 outside the active area, without significantly increasing the base resistance of the BJT device 10'.

In order to fabricate the BJT devices of the present invention as described hereinabove, it is important to provide a method that has the ability to precisely define the second STI region with the desired undercut angle.

One possible method for forming the second STI region involves selectively etching the collector region (which is typically formed of single crystal silicon) over the active base region (which is typically formed of single crystal silicon or silicon germanium) by using a hydroxide-based wet etching process to form a cavity that undercuts the active base region with the desired undercut angle, followed by filling the cavity with an insulator material, thereby forming the second STI region. The hydroxide-based wet etching process employs ammonium hydroxide ($NH_4OH$) as the etching agent, which has a high etching selectivity of silicon over silicon germanium and can therefore be used to selectively etch the collector region without damaging the active base region.

However, the hydroxide-based wet etching process is an anisotropic process, and its etching rate is significantly influenced by the specific crystallographic direction of the silicon. For example, the etching rates along the (100) and (110) directions of silicon are much larger than that along the (111) direction of silicon. When the hydroxide-based wet etching process is used to etch the collector region, which typically comprises single crystal silicon with the horizontally and vertically aligned (100) and (110) surfaces and the diagonally aligned (111) surfaces, the etching proceeds significantly faster in the horizontal and vertical directions but relatively slower in the diagonal directions. Consequentially, a cavity with a diamond-shaped cross-section is typically formed in the collector region, which undercuts the active base region with an obtuse undercut angle that is significantly larger than 90°.

Figure 3:
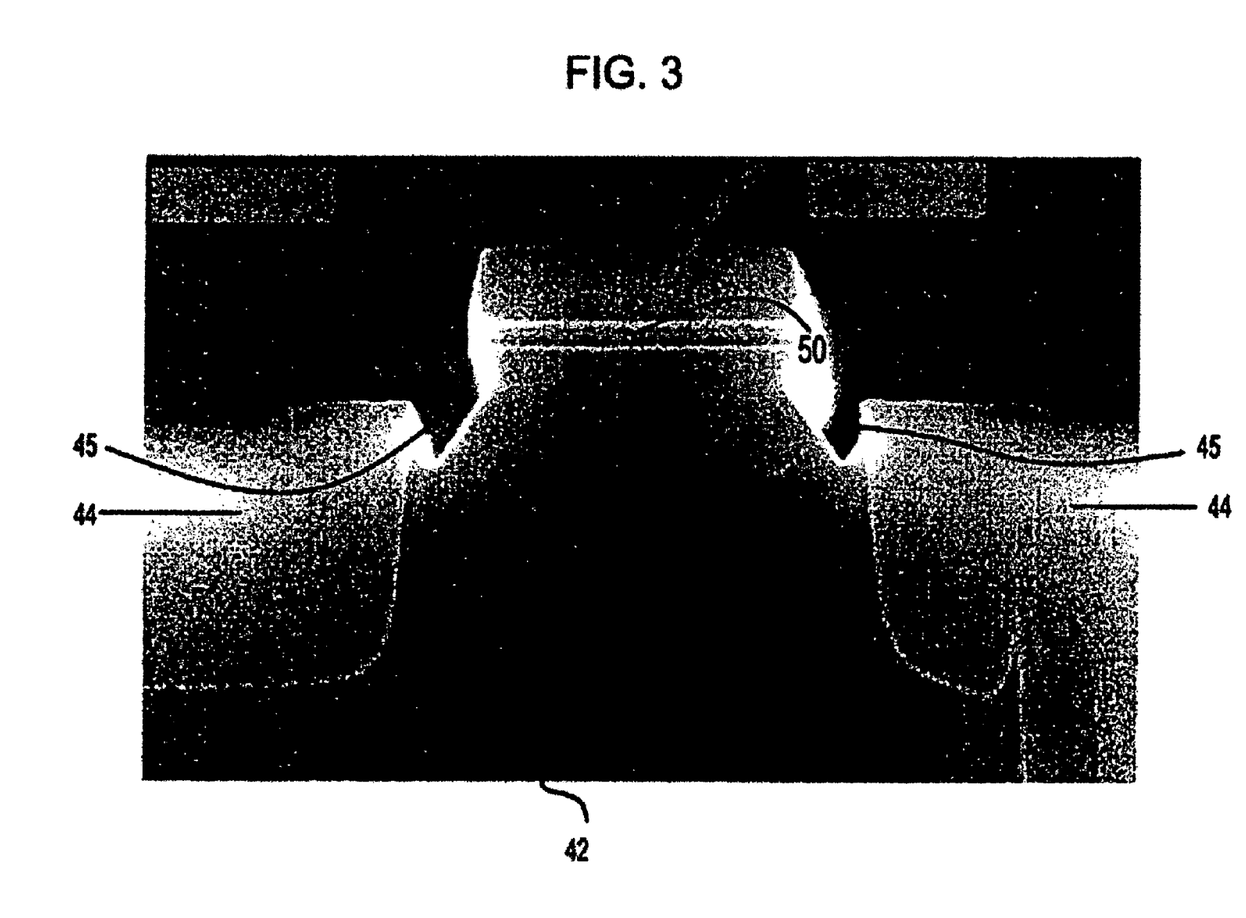
FIG. 3 shows a cross-sectional pictorial view of a diamond-shaped cavity formed by a hydroxide-based anisotropic etching process.

FIG. 3 shows a cross-sectional pictorial view of a diamond-shaped cavity 45, which is formed by the hydroxide-based anisotropic etching process as described hereinabove. The cavity 45 is located in a Si collector region 42 adjacent to a first STI region 44 and undercuts a SiGe active base region 50 of a to-be-formed BJT device.

A second STI region formed in such a diamond-shaped cavity results in only slightly reduced collector-to-base capacitance, but it significantly increases the base resistance and has a deleterious impact on the device performance of the resulting BJT. Further, the width and depth of the diamond-shaped cavity are determined by the etching rates along the (100) and (110) directions of the silicon. Therefore, they are closely correlated with each other and cannot be adjusted independently as desired. In order to create more undercut underneath the SiGe or silicon active base region 50, the etching must proceed further both in the horizontal and vertical directions, which presents a challenge for optimal scaling of the second STI region.

The present invention solves the above-described problems by using a porous silicon structure to precisely define the second STI region with the desired undercut angle. Specifically, a porous silicon structure with independently defined width and depth is provided in the collector region of a to-be-formed BJT device outside the active area thereof. The active base region is then formed over the collector region, while a portion of the active base region overlays the porous silicon structure. Subsequently, the porous silicon structure is either etched away or converted by oxidation/nitrification to form the desired second STI region. The shape of the porous silicon structure correspondingly and precisely determines the shape as well as the undercut angle of the second STI region so formed.

FIGS. 4A-4I show the processing steps for forming an exemplary second STI region as that shown in FIG. 2A, according to one embodiment of the present invention.

Figure 4A:
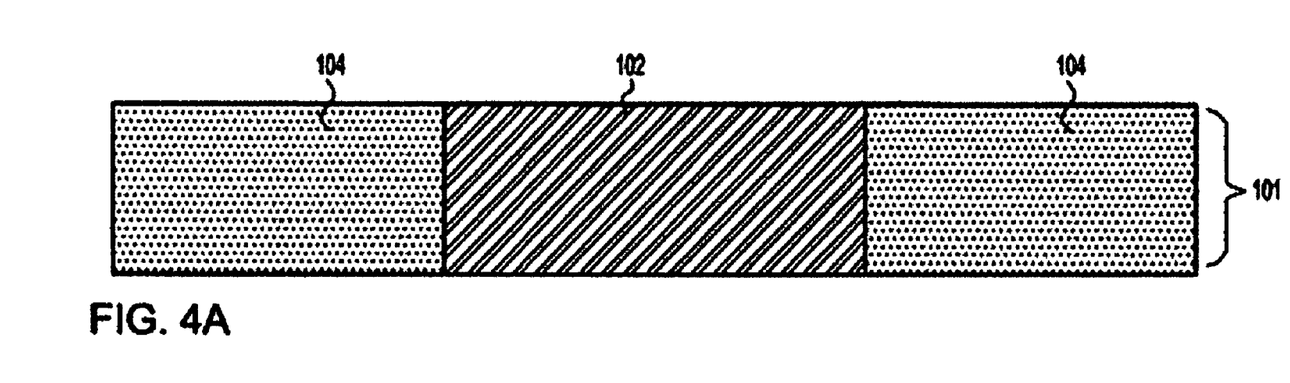
FIGS. 4A-4I shows the processing steps for forming a second STI region that has a substantially triangular cross-section with an undercut angle of less than 90°, according to one embodiment of the present invention.

Reference is first made to FIG. 4A, which shows a semiconductor substrate 101, which comprises a collector region 102 adjacent to a first STI region 104 in an upper surface thereof. The semiconductor substrate 101 may comprise any semiconductor material including, but not limited to: Si, SiC, SiGe, SiGeC, Ge alloys, GaAs, InAs, InP, as well as other III-V or II-VI compound semiconductors. Semiconductor substrate 101 may also comprise an organic semiconductor structure, a layered semiconductor structure such as Si/SiGe, a silicon-on-insulator structure or a SiGe-on-insulator structure. In a preferred embodiment of the present invention, the semiconductor substrate 101 comprises a Si-containing semiconductor material, i.e., a semiconductor material that includes silicon. More preferably, the upper surface of the semiconductor 101, in which the collector region 102 is located, comprises single crystal silicon. The semiconductor substrate 101 may be doped, undoped or contain doped and undoped regions therein (not shown).

The first STI region 104 is formed in the upper surface of the semiconductor substrate 101 to isolate the collector region 102 from other device structures formed in the semiconductor substrate 101. The first STI region 104 may comprise any suitable insulator material(s), including, but not limited to: oxides, nitride, and oxynitrides, and it can be readily formed utilizing a conventional trench isolation process well known to those skilled in the art. For example, lithography, etching and filling of the trench with a trench dielectric may be used in forming the first STI region 104.

Optionally, a liner may be formed in the trench prior to trench fill, a densification step may be performed after the trench fill and a planarization process may follow the trench fill as well.

Figure 4B:
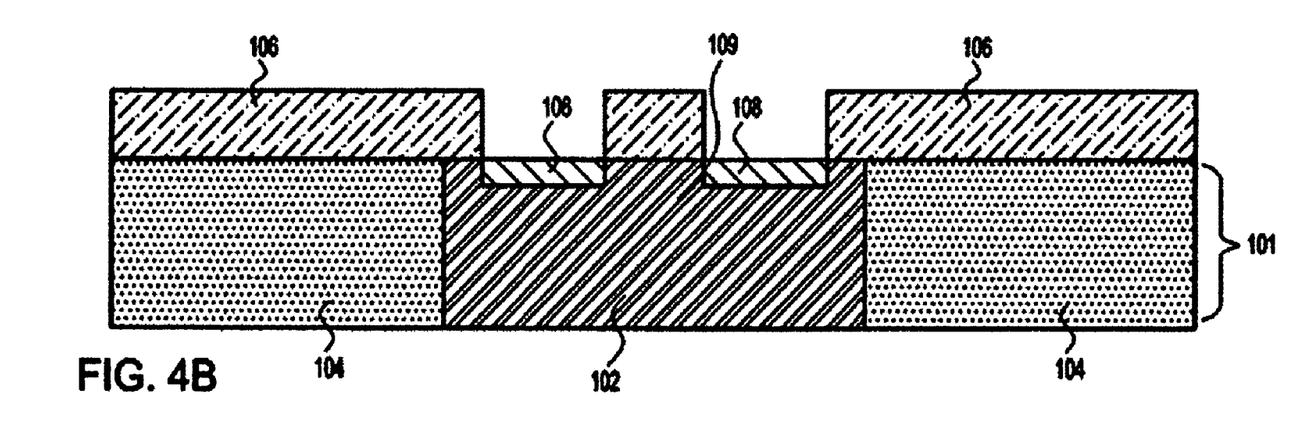

Next, a patterned dielectric hard mask layer 106 is formed on an upper surface of the semiconductor substrate 101. The dielectric hard mask 106 is preferably patterned by lithography and etching. For example, a photoresist (not shown) is first applied to the upper surface of the dielectric hard mask layer 106, followed by exposing the photoresist to a desired pattern of radiation and developing the exposed photoresist utilizing a conventional resist developer. The pattern in the photoresist is then transferred to the dielectric mask layer 106, utilizing one or more wet or dry etching steps. The patterned photoresist is then removed after etching has been completed. The patterned dielectric hard mask layer 106 specifically defines an expose surface region 108, which encircles a protected surface region 109 that is covered by the dielectric hard mask layer 106, as shown in FIG. 4B.

The exposed surface region 108 in the collector region 102 is then selectively porousified to form a porous surface region 108. Any suitable porousification techniques can be used for porousifying the exposed surface region 108 in the present invention. Preferably but not necessarily, the exposed surface region 108 is first doped with a p-type dopant species to form a doped surface region 108, which is then chemically or electrochemically etched by a HF anodizing solution to form the porous surface region 108. Alternatively, a laser beam is irradiated upon the exposed surface region 108, which is concurrently electrochemically etched by a HF anodizing solution to form the porous surface region 108.

HF-based anodization is a widely known and generally accepted technique of forming porous Si and other porous semiconductors, such as, for example, Ge and GaAs. Specifically, it is performed in a HF-containing anodizing bath in which the semiconductor substrate 101 is immersed and biased positively. The bath also includes an electrode that is biased negatively. Any other known anodization apparatus can also be employed in the present invention in forming the porous surface section 108, so long as it is designed to allow a flow of electrical current in uniform density all throughout the surface area of the semiconductor substrate 101.

Preferably, the average porosity of the porous surface region 108 is greater than 40%, more preferably from about 50% to about 80%. The exact porosity can be readily adjusted according to specific application requirements, by varying the dopant concentration, the HF concentration of the anodizing solution, the laser irradiation intensity, the current density, etc.

Figure 4C:
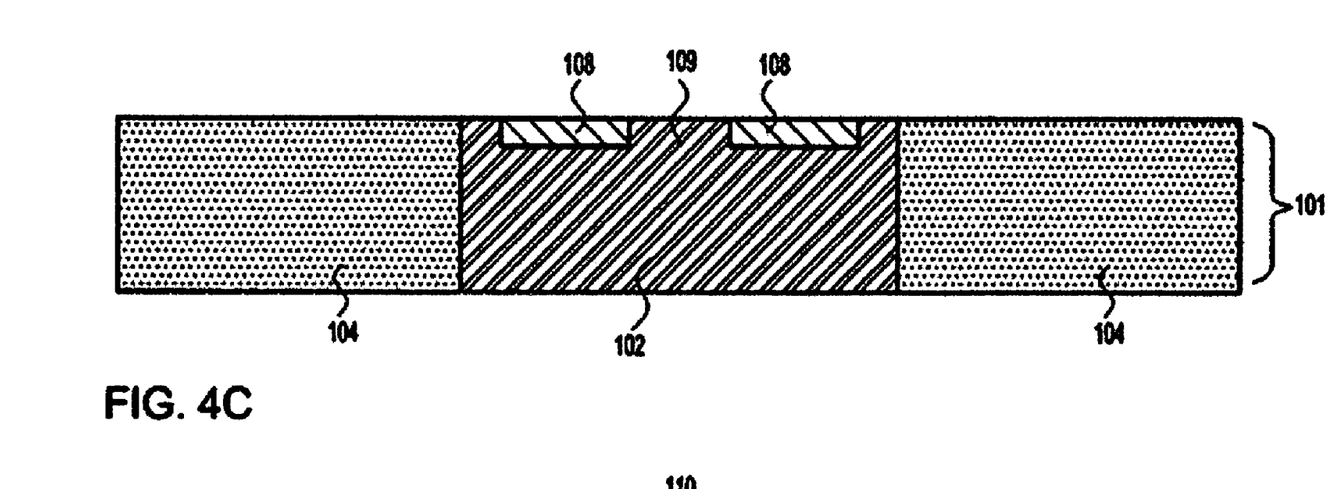

After the porification step, the patterned dielectric hard mask layer 106 is removed to expose the protected surface region 109, which is non-porous and is bounded by the porous surface region 108, as shown in FIG. 4C. Optionally, the porous surface region 108 may be annealed at a temperature between 600 and 1100° C. under a hydrogen flow. This will form a crystalline silicon "skin" on the surface of the porous silicon that will allow for better growth of the active base layer.

Figure 4D:
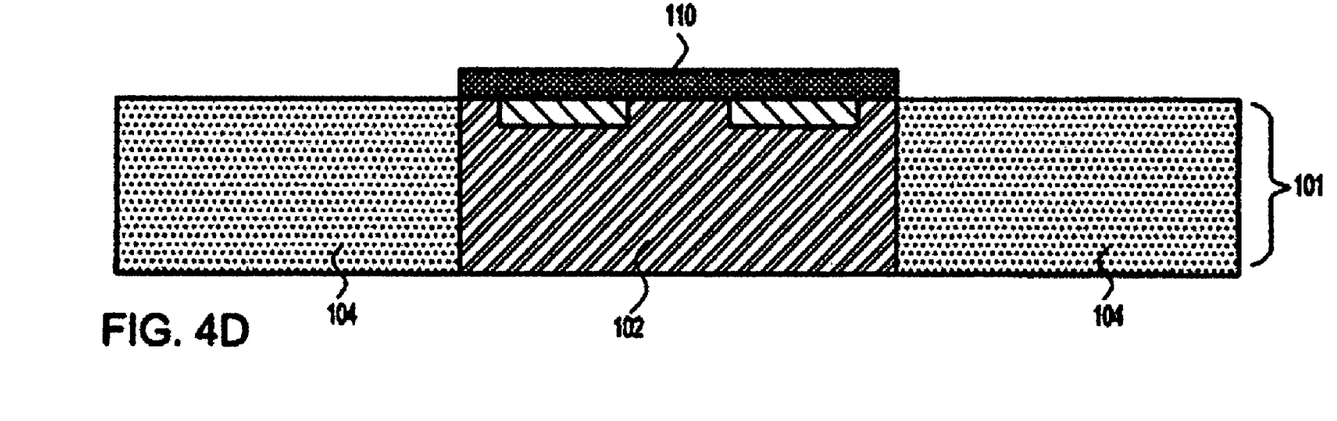

An active base layer 110 is then formed over the collector region 102, which includes both the non-porous surface region 109 and the porous surface region 108, as shown in FIG. 4D. Although the active base layer 110 may comprise any suitable semiconductor material(s), it preferably comprises single crystal silicon germanium. More preferably, the active base layer 110 comprises a graded Ge content profile (i.e., the Ge content changes in the SiGe active base layer 110) with the highest Ge content less than or equal to 30 atomic percent. Such a graded Ge content profile in the active base layer 110 creating a drift field with decreasing band gap along the direction of the electron flow thereacross. The active base layer 110 can be formed by any suitable chemical vapor deposition (CVD) techniques, and preferably, a low temperature epitaxial (LTE) CVD process is employed for forming the active base layer 110. LTE CVD processes are well known in the art and has been widely used for forming the active bases of BJT devices, so the processing details associated with LTE CVD are not discussed herein in order to avoid obscuring the present invention.

Figure 4E:
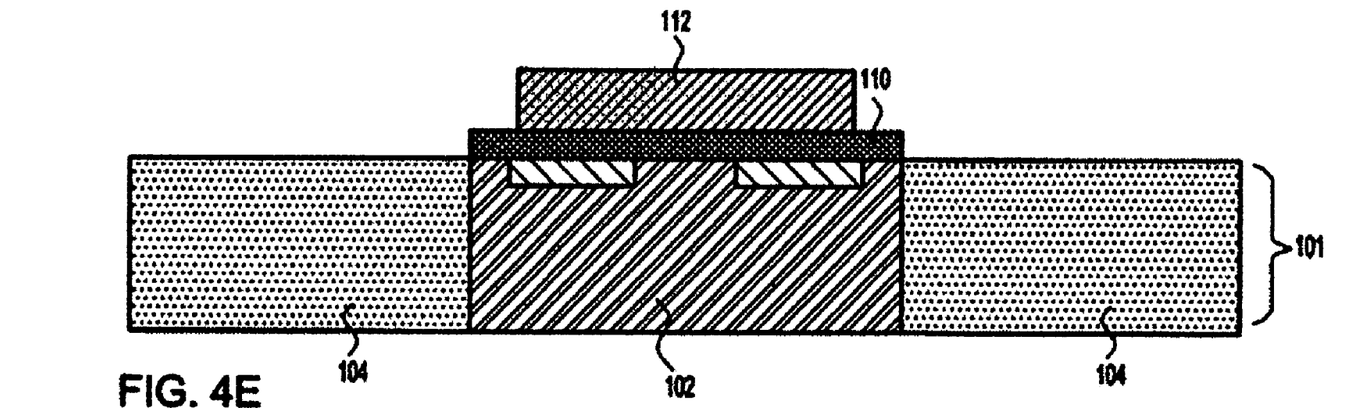

FIG. 4E shows subsequent formation of a second mask layer 112 over the active base layer 110. The second mask layer 112 functions to mask off the active area of the to-be-formed BJT device, and it may comprise any suitable masking material. Preferably, the second mask layer 112 comprises silicon nitride.

Figure 4F:
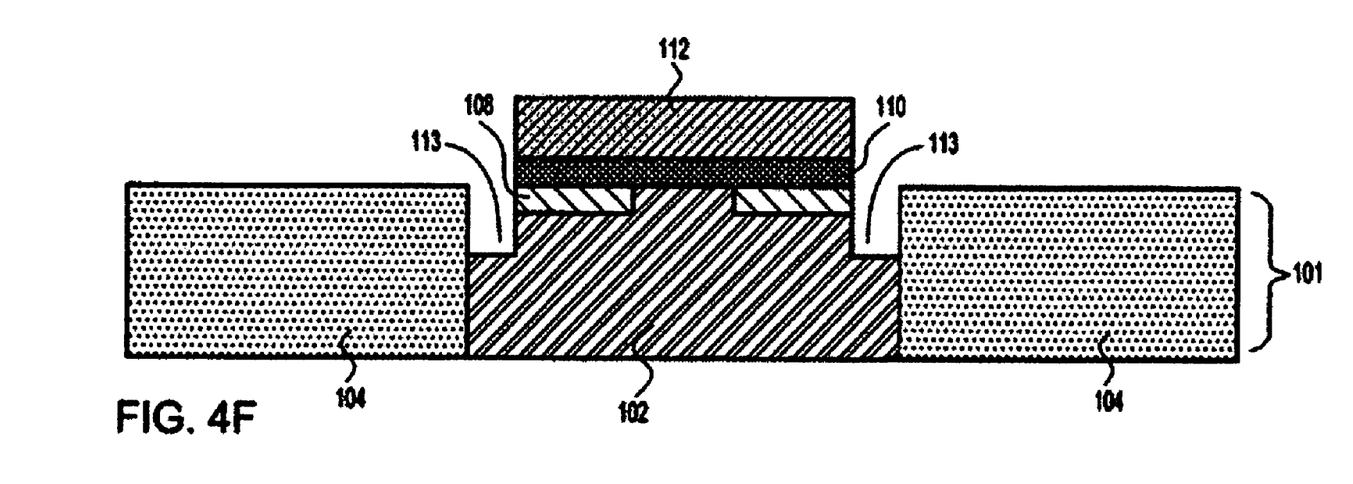

FIG. 4F shows selective etching of the active base layer 110 and the collector region 102 using the second mask layer 112. Edges of the active base layer 110 and the collector region 102 beyond the active area of the device are selectively removed to form a notched region 113, which is located between the first STI region 104 and the collector region 102. A sidewall of the porous surface section 108 adjacent to the notched region 112 is thereby exposed. The selective etching can be carried out by any suitable dry or wet etching processes, and preferably, a reactive ion etching (RIE) process is used for etching the notched region 113 in the present invention.

Figure 4G:
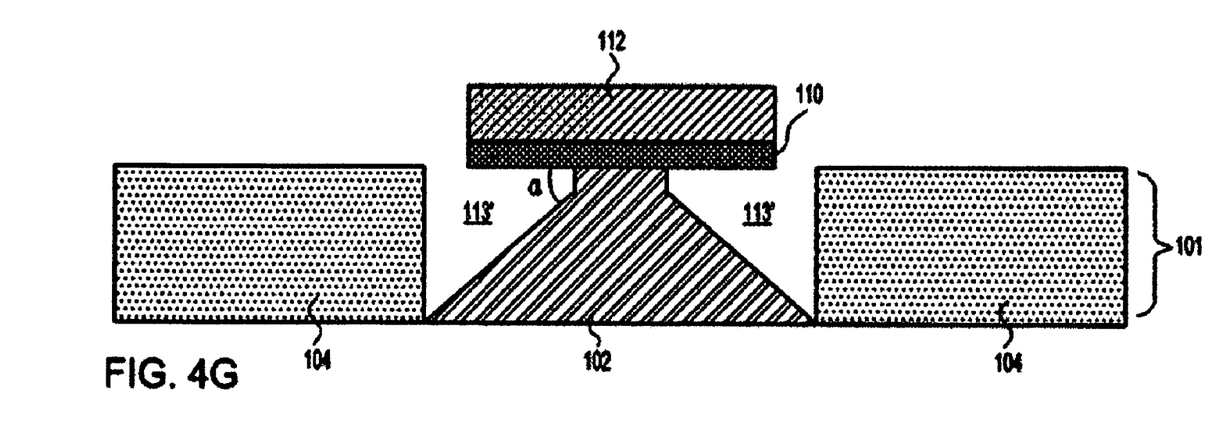

Subsequently, a hydroxide-based wet etching process is carried out in the notched region 113. The porous surface section 108 is first removed by such a hydroxide-based wet etching process, followed by removal of a portion of the collector region 102 underneath the porous surface section 108. Due to the anisotropical nature of the hydroxide-based wet etching process, as described hereinabove, a cavity 113' with a substantially triangular cross-section is formed, which undercuts a portion of the active base layer 110 with an undercut angle α of less than 90°, as shown in FIG. 4G.

Note that in this specific embodiment, the width of the cavity 113' correlates with the width of the porous surface section 108, while the depth of the cavity 113' correlates with the depth of the notched region 113 as well as the thickness of the porous surface section 108. Therefore, the width and depth of the cavity 113' can be independently adjusted to provide an undercut angle α of any desired degree. Preferably, the undercut angle is not more than about 60°.

Figure 4H:
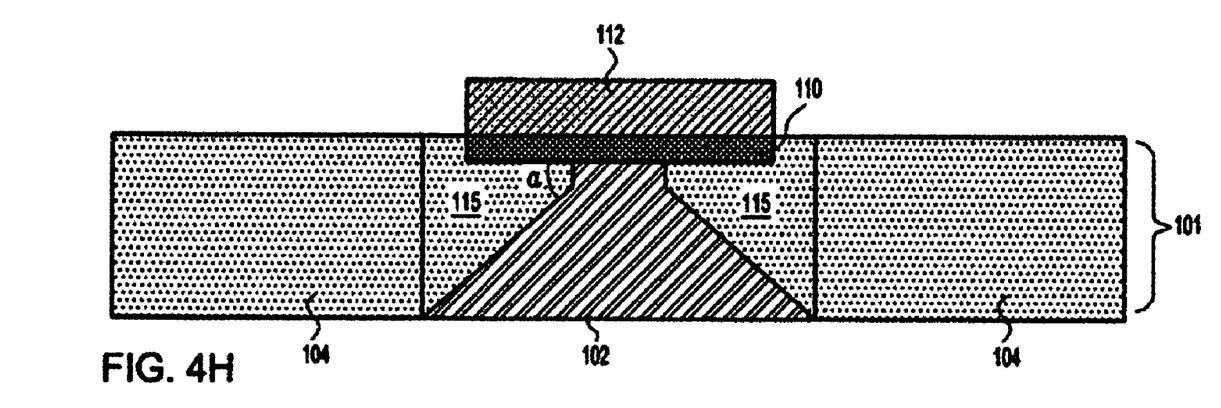

The cavity 113' is then at least partially filled, and preferably completely filled, with an insulator material to form the second STI region 115, which extends between the first STI region 104 and the collector region 102 and which undercuts the active base layer 110 with an undercut angle α of less than 90°, as shown in FIG. 4H. The insulator material used for forming the second STI region 115 can be any suitable insulator material, including, but not limited to: oxides, nitrides, oxynitrides, and it be either the same or different from the insulator material contained in the first STI region 104.

Figure 4I:
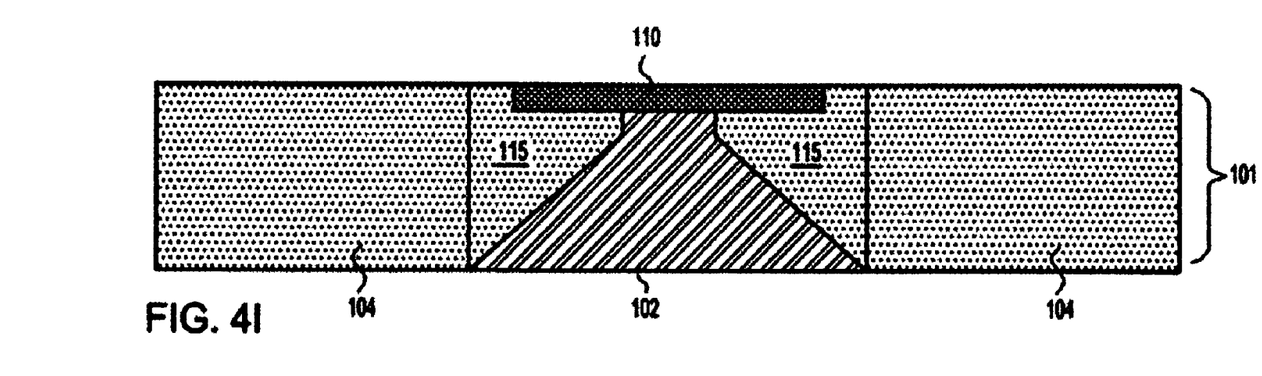

Subsequently, the second mask layer 112 is removed from the active base layer 110, and an optional chemical mechanical polishing step can be carried out to planarize the respective upper surfaces of the first STI region 104, the second STI region 115, and the active base layer 110, as shown in FIG. 4I.

Additional components of the BJT device can then be fabricated over the structure shown in FIG. 4I by using conventional BJT processing steps, which are well known in the art and are therefore not described in detail.

FIGS. 5A-5D show the processing steps for forming another exemplary second STI region as that shown in FIG. 2B, according to an alternative embodiment of the present invention.

Figure 5A:
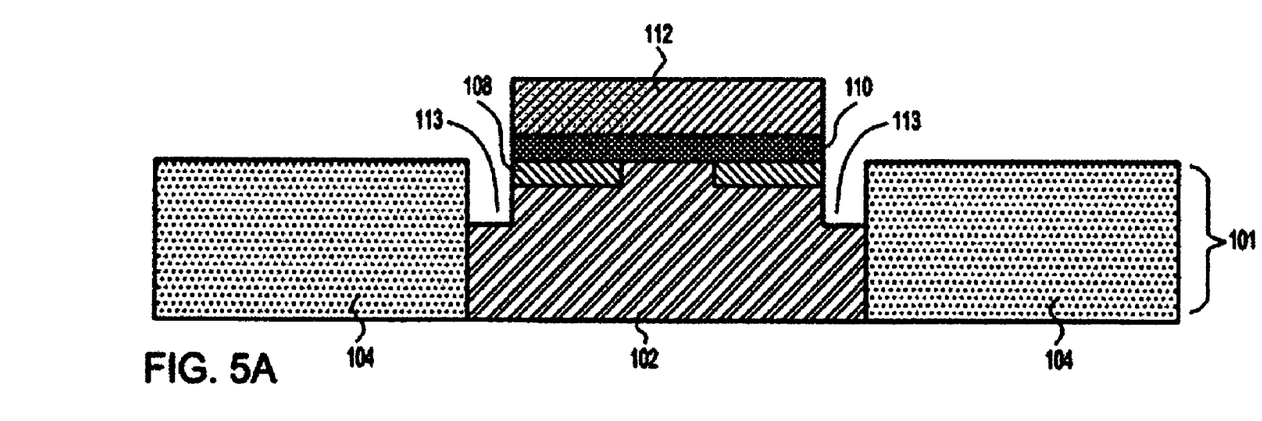
FIGS. 5A-5D shows the processing steps for forming a second STI region that has a substantially rectangular cross-section with an undercut angle of about 90°, according to one embodiment of the present invention.
Figure 5B:
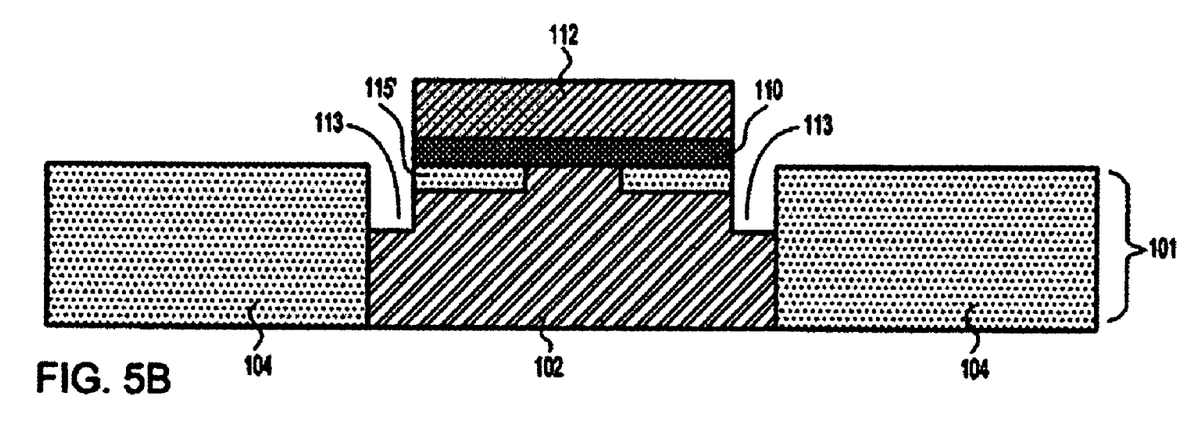

Specifically, a notched region 113 as shown in FIG. 5A is first formed by using the same processing steps as shown in FIGS. 4A-4F, to expose a sidewall of the porous surface section 108. The porous surface section 108 is then treated by oxidation and/or nitrification. In this manner, the semiconductor material contained in the porous surface section 108 is converted into an insulator material (such as an oxide, a partial oxide, a nitride, or an oxynitride), thereby forming a second STI region 115' that undercuts the active base layer 110 with a substantially straight undercut angle, as shown in FIG. 5B.

Note that the second STI region 115' so formed has a rectangular cross-sectional shape that resembles the porous surface section 108. Because the porous surface section 108 has independently definable width and depth, the width and depth of the second STI region 115' can be correspondingly adjusted in an independent manner to achieve the desired device performance.

Figure 5C:
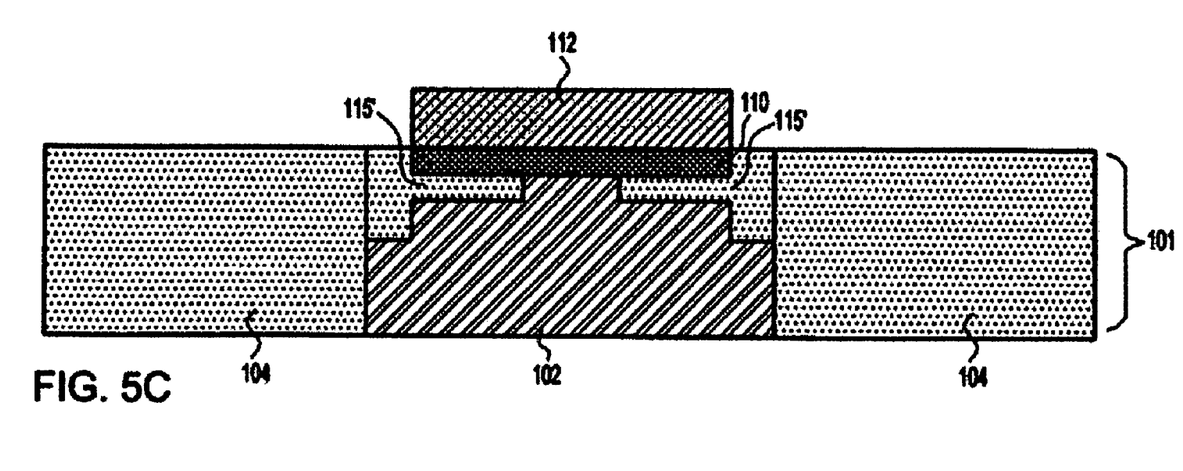

After the oxidation and/or nitrification, the notched region 113 is at least partially filled with an insulator material, and the first STI region 104 and the second STI region 115' are thereby connected, as shown in FIG. 5C. Subsequently, the second mask layer 112 is removed from the active base layer 110, and an optional chemical mechanical polishing step can be carried out to planarized the respective upper surfaces of the first STI region 104, the second STI region 115', and the active base layer 110, as shown in FIG. 5D.

Figure 5D:
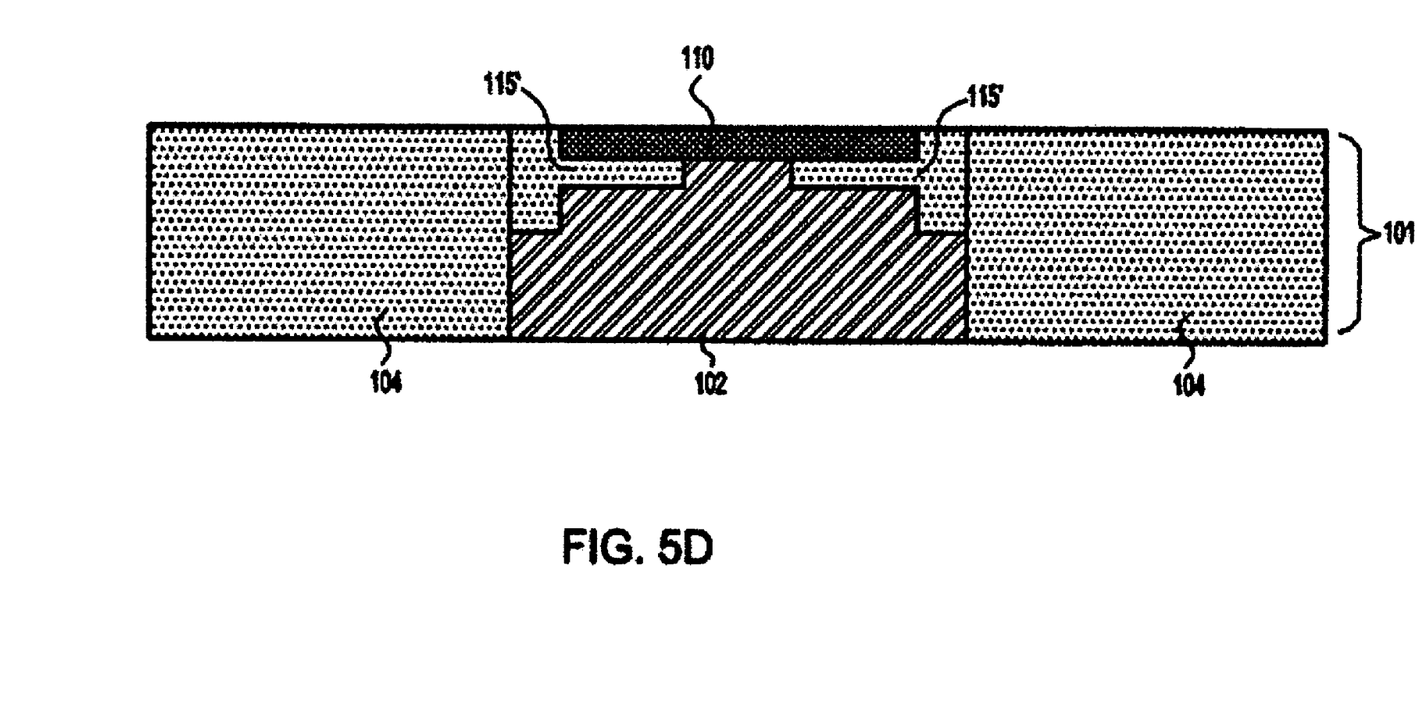

Additional components of the BJT device can then be fabricated over the structure shown in FIG. 5D by using conventional BJT processing steps, which are well known in the art and are therefore not described in detail.

While FIGS. 2A-5D illustratively demonstrate exemplary second STI structures for BJT devices and exemplary processing steps for manufacturing same, according to specific embodiments of the present invention, it is clear that a person ordinarily skilled in the art can readily modify the structures and processing steps illustrated herein, for adaptation to specific application requirements, consistent with the above descriptions. It should therefore be recognized that the present invention is not limited to the specific embodiments illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A bipolar junction transistor (BJT) comprising:
a collector region located in a semiconductor substrate surface and adjacent to a first shallow trench isolation (STI) region;
an active base region located on the collector region and having an upper surface and a lower surface and comprising a single crystalline material;
an extrinsic base region located on the active base region;
an emitter region having at least a portion that extends through the extrinsic base region and contacts the upper surface of the active base region; and
a second STI region that extends between the first STI region and the collector region and undercuts a portion of the active base region with an undercut angle of not more than about 90°, wherein said undercut angle is located between a first surface and a second surface of said second STI region, wherein said first surface abuts said lower surface of said active base region, wherein said second surface abuts said collector region, and wherein said first STI region laterally abuts said second STI region.

2. The BJT of claim 1, wherein the undercut angle is about 90°.

3. The BJT of claim 1, wherein the undercut angle is less than about 90°.

4. The BJT of claim 1, wherein the undercut angle is not more than about 54.7°.

5. The BJT of claim 1, wherein the active base region comprises a SiGe-containing layer.

6. The BJT of claim 1, wherein the emitter is a T-shaped emitter comprising a shoulder section located over the extrinsic base region and a leg section extending through the extrinsic base region and contacting the upper surface of the active base region.

7. The BJT of claim 1, wherein the first and second STI regions comprise the same insulating material.

8. The BJT of claim 1, wherein the first and second STI regions comprise different insulating materials.

9. The BJT of claim 1, wherein the second STI region comprises an insulator material selected from the group consisting of silicon oxide, partial silicon oxide, silicon nitride, and silicon oxynitride.

10. The BJT of claim 1, wherein the second STI region has a substantially triangular cross-section with an undercut angle of less than about 90°.

11. The BJT of claim 1, wherein the second STI region has a substantially rectangular cross-section with an undercut angle of about 90°.

12. A method for forming the BJT of claim 10, comprising at least:
providing a semiconductor substrate surface that comprises a collector region adjacent to a first shallow trench isolation (STI) region;
selectively porousifying an upper surface of the collector region to form a non-porous surface section adjacent to a porous surface section;
forming an active base region over both the non-porous and porous surface sections of the collector region, said active base region comprising a single crystalline material;
selectively etching edges of the active base region and the collector region to form a notched region between the first STI region and the collection region, wherein a sidewall of the porous surface section of the collector region is exposed;
anisotropically etching the collector region from the notched region to remove the porous surface section and a section of the collection region thereunder, thereby forming a cavity that has a substantially triangular cross-section and undercuts a portion of the active base region with an undercut angle of less than about 90°; and
filling the cavity with an insulating material to form a second STI region that extends between the first STI region and the collector region, wherein said second STI region has a substantially triangular cross-section and undercuts a portion of the active base region with an undercut angle of less than about 90°, wherein said undercut angle is formed between a first surface and a second surface of said second STI region, wherein said first surface abuts a lower surface of said active base region, wherein said second surface abuts said collector region, and wherein said first STI region laterally abuts said second STI region.

13. The method of claim 12, wherein the upper surface of the collector region is selectively porified by:
   selectively doping an upper surface of the collector region to form a doped surface region adjacent to an undoped surface region; and
   chemically or electrochemically etching the doped surface region to form a porous surface section, wherein the undoped surface region forms a non-porous surface section adjacent to said porous surface section.

14. The method of claim 12, wherein the collector region comprises silicon, and wherein the anisotropical etching is carried out by using a hydroxide-based wet etching process that selectively etches the silicon along its (100) and (110) directions over its (111) direction.

15. The method of claim 12, further comprising planarizing the first STI region, the second STI region, and the active base region so that their respective upper surfaces are substantially coplanar.

16. A method for forming the BJT of claim 11, comprising at least:
   providing a semiconductor substrate surface that comprises a collector region adjacent to a first shallow trench isolation (STI) region;
   selectively porousifying an upper surface of the collector region to form a non-porous surface section adjacent to a porous surface section;
   forming an active base region over both the non-porous and porous surface sections of the collector region, said active base region comprising a single crystalline material;
   selectively etching edges of the active base region and the collector region to form a notched region between the first STI region and the collection region, wherein a sidewall of the porous surface section of the collector region is exposed;
   treating the porous surface section of the collector region by oxidization and/or nitrification to form a second STI region that has a substantially rectangular cross-section and undercuts a portion of the active base region with an undercut angle of about 90°; and
   filling the notched region with an insulating material, thereby connecting the first STI region with the second STI region, wherein said undercut angle is formed between a first surface and a second surface of said second STI region, wherein said first surface abuts a lower surface of said active base region, wherein said second surface abuts said collector region, and wherein said first STI region laterally abuts said second STI region.

17. The method of claim 16, wherein the upper surface of the collector region is selectively porified by:
   selectively doping an upper surface of the collector region to form a doped surface region encircling an undoped surface region; and
   chemically or electrochemically etching the doped surface region to form a porous surface section, wherein the undoped surface region forms a non-porous surface section adjacent to said porous surface section.

18. The method of claim 16, wherein the porous surface section of the collector region is treated by oxidization, and wherein the second STI region so formed comprises an oxide or partial oxide.

19. The method of claim 16, wherein the porous surface section of the collector region is treated by nitrification, and wherein the second STI region so formed comprises a nitride.

20. The method of claim 16, wherein the porous surface section of the collector region is treated by oxidation and nitrification, and wherein the second STI region so formed comprises an oxynitride.

* * * * *